(12) United States Patent
Han et al.

(10) Patent No.: US 8,841,218 B2
(45) Date of Patent: Sep. 23, 2014

(54) RESIST UNDERLAYER COMPOSITION AND PROCESS OF PRODUCING INTEGRATED CIRCUIT DEVICES USING SAME

(75) Inventors: Kwen-Woo Han, Uiwang-si (KR); Mi-Young Kim, Uiwang-si (KR); Woo-Jin Lee, Uiwang-si (KR); Han-Song Lee, Uiwang-si (KR); Seung-Hee Hong, Uiwang-si (KR); Sang-Kyun Kim, Uiwang-si (KR); Jin-Wook Lee, Uiwang-si (KR)

(73) Assignee: Cheil Industries, Inc., Gumi-si, Kygeongsangbuk-do (KR)

( * ) Notice: Subject to any disclaimer, the term of this patent is extended or adjusted under 35 U.S.C. 154(b) by 120 days.

(21) Appl. No.: 13/571,751

(22) Filed: Aug. 10, 2012

(65) Prior Publication Data
US 2013/0037921 A1 Feb. 14, 2013

(30) Foreign Application Priority Data

Aug. 11, 2011 (KR) ........................ 10-2011-0080331

(51) Int. Cl.
*H01L 21/311* (2006.01)
*C08L 83/06* (2006.01)
(52) U.S. Cl.
CPC ..................................... *C08L 83/06* (2013.01)
USPC .... 438/703; 257/635; 257/588; 257/E29.002; 257/E21.258; 524/99; 524/317
(58) Field of Classification Search
None
See application file for complete search history.

(56) References Cited

U.S. PATENT DOCUMENTS 3,997,501 A * 12/1976 McLeod ........................ 524/100
2008/0118875 A1 5/2008 Kim et al.
2010/0252917 A1 10/2010 Karkkainen

FOREIGN PATENT DOCUMENTS

| EP | 1 628 160 A2 | 2/2006 |
| KR | 10-0493855 B1 | 5/2005 |
| KR | 10-0796047 B1 | 1/2008 |
| KR | 10-2011-0079202 A | 7/2011 |

\* cited by examiner

*Primary Examiner* — Yasser A Abdelaziez
(74) *Attorney, Agent, or Firm* — Lee & Morse, P.C.

(57) ABSTRACT

A resist underlayer composition, including a solvent, and an organosilane condensation polymerization product of hydrolyzed products produced from a compound represented by Chemical Formula 1, a compound represented by Chemical Formula 2, and a compound represented by Chemical Formula 3.

14 Claims, No Drawings

RESIST UNDERLAYER COMPOSITION AND PROCESS OF PRODUCING INTEGRATED CIRCUIT DEVICES USING SAME

CROSS-REFERENCE TO RELATED APPLICATION

This application claims priority under 35 U.S.C. §119 to Korean Patent Application No. 10-2011-0080331, entitled "Resist Underlayer Composition and Process of Producing Integrated Circuit Devices using Same," which was filed on Aug. 11, 2011, in the Korean Intellectual Property Office, the entire contents of which is hereby incorporated by reference.

BACKGROUND

1. Field

This disclosure relates to a resist underlayer composition and a method of manufacturing a semiconductor integrated circuit device using the same.

2. Description of the Related Art

Improved performance and higher productivity of semiconductors may be achieved through higher integration. The higher integration may require a smaller line width of a lower substrate, but an aspect ratio may also be required to have a predetermined value in order to prevent pattern collapse, and therefore, a smaller line width may also require a thinner photoresist. However, a decrease in the thickness of the photoresist may also result in a thin lower layer of silicon, which may fail to act as a mask during a pattern transfer process (e.g., an etching process). That is, the photoresist may be entirely consumed during the etching, and thus the substrate may not be etched down to a desired depth.

SUMMARY

Embodiments are directed to a resist underlayer composition, including a solvent, and an organosilane condensation polymerization product of hydrolyzed products produced from a compound represented by Chemical Formula 1, a compound represented by Chemical Formula 2, and a compound represented by Chemical Formula 3:

$$[R^1O]_3Si\text{—}X \quad \text{[Chemical Formula 1]}$$

wherein, in Chemical Formula 1,
R$^1$ may be a substituted or unsubstituted C1 to C6 alkyl group, and X may be a substituted or unsubstituted C6 to C30 aryl group, $$[R^2O]_3Si\text{—}R^3 \quad \text{[Chemical Formula 2]}$$

wherein, in Chemical Formula 2,
R$^2$ may be a substituted or unsubstituted C1 to C6 alkyl group, and R$^3$ may be a substituted or unsubstituted C1 to C12 alkyl group, $$[R^4O]_3Si\text{—}O\text{—}Si[OR^5]_3 \quad \text{[Chemical Formula 3]}$$

wherein, in Chemical Formula 3,
R$^4$ and R$^5$ each independently may be a substituted or unsubstituted C1 to C6 alkyl group.

The hydrolyzed products produced from compounds represented by Chemical Formulae 1 to 3 may be compounds represented by Chemical Formulae 4 to 6, respectively:

$$[HO]_a[R^1O]_{(3-a)}Si\text{—}X \quad \text{[Chemical Formula 4]}$$

wherein, in Chemical Formula 4,
R$^1$ may be a substituted or unsubstituted C1 to C6 alkyl group, X may be a substituted or unsubstituted C6 to C30 aryl group, and a may be greater than zero and less than or equal to 3, $$[HO]_b[R^2O]_{(3-b)}Si\text{—}R^3 \quad \text{[Chemical Formula 5]}$$

wherein, in Chemical Formula 5,
R$^2$ may be a substituted or unsubstituted C1 to C6 alkyl group, R$^3$ may be a substituted or unsubstituted C1 to C12 alkyl group, and b may be greater than zero and less than or equal to 3, $$[HO]_d[R^4O]_{(3-d)}Si\text{—}O\text{—}Si[OH]_e[OR^5]_{(3-e)} \quad \text{[Chemical Formula 6]}$$

wherein, in Chemical Formula 6,
R$^4$ and R$^5$ each independently may be a substituted or unsubstituted C1 to C6 alkyl group, and d and e each independently may be greater than zero and less than or equal to 3.

The organosilane condensation polymerization product may include a repeating unit represented by Chemical Formula 7:

$$[(SiO_{1.5}\text{—}O\text{—}SiO_{1.5})_p(R^3SiO_{1.5})_q(XSiO_{1.5})_r]_n \quad \text{[Chemical Formula 7]}$$

wherein, in Chemical Formula 7,
R$^3$ may be a substituted or unsubstituted C1 to C12 alkyl group, X may be a substituted or unsubstituted C6 to C30 aryl group, 0.001≤p≤0.9, 0.001≤q≤0.9, 0.001≤r≤0.9, p+q+r=1, and n may range from about 50 to about 300.

Based on 100 parts by weight of the compounds represented by Chemical Formulae 1 to 3, the compound represented by Chemical Formula 1, the compound represented by Chemical Formula 2, and the compound represented by Chemical Formula 3 may be used in an amount of about 5 to about 90 parts by weight, about 5 to about 90 parts by weight of, and about 5 to about 90 parts by weight, respectively.

The hydrolyzed products may be obtained through hydrolysis of the compounds of Chemical Formulae 1 to 3 under an acid catalyst selected from nitric acid, sulfuric acid, hydrochloric acid, hydrofluoric acid, bromic acid, iodic acid, p-toluene sulfonate hydrate, 2,4,4,6-tetrabromocyclohexadienone, benzoin tosylate, 2-nitrobenzyl tosylate, diethylsulfate, and a combination thereof.

The acid catalyst may be included in an amount of about 0.001 to about 5 parts by weight based on 100 parts by weight of the compounds represented by Chemical Formulae 1 to 3.

The hydrolysis may be carried out in an alcohol-based reaction solvent.

The organosilane condensation polymerization product may have a weight average molecular weight of about 2,000 to about 50,000.

The organosilane condensation polymerization product may be included in an amount of about 0.1 to about 50 parts by weight based on 100 parts by weight of the resist underlayer composition.

The solvent may be selected from acetone, tetrahydrofuran, benzene, toluene, diethylether, chloroform, dichloromethane, ethyl acetate, propylene glycol monomethyl ether, propylene glycol ethyl ether, propylene glycol propyl ether, propylene glycol monomethyl ether acetate, propylene glycol ethyl ether acetate, propylene glycol propyl ether acetate, ethyl lactate, δ-butyrolactone, methyl isobutyl ketone, dimethylether, dibutylether, methanol, ethanol, tetrabutylammonium acetate, tetrabutylammonium azide, tetrabutylammonium benzoate, tetrabutylammonium bisulfate, tetrabutylammonium bromide, tetrabutylammonium chloride, tetrabutylammonium cyanide, tetrabutylammonium fluoride, tetrabutylammonium iodide, tetrabutylammonium sulfate, tetrabutylammonium nitrite, tetrabutylammonium p-toluene sulfonate, tetrabutylammonium phosphate, and a combination thereof.

The resist underlayer composition may further include an additive selected from a cross-linking agent, a radical stabilizer, a surfactant, a pH controlling agent, and a combination thereof.

The resist underlayer composition may further include an additive selected from pyridinium p-toluene sulfonate, amidosulfobetain-16, ammonium(−)-camphor-10-sulfonate, ammonium formate, alkylammonium formate, pyridinium formate, alkylammonium nitrate, and a combination thereof.

Embodiments are also directed to a method of manufacturing a semiconductor integrated circuit device, including providing a material layer on a substrate, forming a first resist underlayer including an organic material on the material layer, spin-on coating the resist underlayer composition on the first resist underlayer to form a second resist underlayer, forming a radiation-sensitive imaging layer on the second resist underlayer, exposing the radiation-sensitive imaging layer to radiation in a pattern to form a pattern of radiation-exposed regions in the radiation-sensitive imaging layer, selectively removing the radiation-sensitive imaging layer and portions of the second resist underlayer to expose portions of the first resist underlayer, selectively removing the second resist underlayer and the portions of the first resist underlayer to expose portions of the material layer, and etching the exposed portions of the material layer using the first resist underlayer as a mask to form a patterned material layer.

The method may further include forming an anti-reflection coating on the second resist underlayer after forming the second resist underlayer.

Embodiments are also directed to a semiconductor integrated circuit device manufactured using the method.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the embodiments to those skilled in the art.

It will also be understood that when a layer or element is referred to as being "on" another layer, it can be directly on the other layer, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, when a specific definition is not otherwise provided, the term "substituted" refers to one substituted with a C1 to C6 alkyl group or a C6 to C12 aryl group. In addition, when a specific definition is not otherwise provided, an alkyl group refers to a C1 to C10 alkyl group.

The resist underlayer composition according to an embodiment includes a solvent and an organosilane condensation polymerization product of hydrolyzed products produced from compounds represented by the following Chemical Formulae 1 to 3.

$[R^1O]_3Si—X$          [Chemical Formula 1]

In Chemical Formula 1, $R^1$ may be a substituted or unsubstituted C1 to C6 alkyl group, and X may be a substituted or unsubstituted C6 to C30 aryl group.

$[R^2O]_3Si—R^3$          [Chemical Formula 2]

In Chemical Formula 2, $R^2$ may be a substituted or unsubstituted C1 to C6 alkyl group, and $R^3$ may be a substituted or unsubstituted C1 to C12 alkyl group.

$[R^4O]_3Si—O—Si[OR^5]_3$          [Chemical Formula 3]

In Chemical Formula 3, $R^4$ and $R^5$ each independently may be a substituted or unsubstituted C1 to C6 alkyl group.

The alkyl group may be a linear or branched alkyl group.

The organosilane condensation polymerization product may be prepared by carrying out a condensation polymerization reaction of hydrolyzed products, which are obtained from hydrolysis of about 5 to about 90 parts by weight of the compound represented by the above Chemical Formula 1, about 5 to about 90 parts by weight of the compound represented by the above Chemical Formula 2, and about 5 to about 90 parts by weight of the compound represented by the above Chemical Formula 3, under an acid catalyst.

An aromatic ring may have an absorption spectrum in a DUV (deep UV) region, and thus, when a compound represented by the above Chemical Formula 1 is used within the above range, the organosilane condensation polymerization product may form a resist underlayer having improved anti-reflection characteristics and improved etching selectivity due to the high content of Si. In addition, the organosilane condensation polymerization product for a resist underlayer composition may have a desired absorbance at a particular wavelength and a refractive index by adjusting the content of the aromatic ring. When a compound represented by the above Chemical Formula 2 is used within the above range, the organosilane condensation polymerization product may have improved storage stability and absorbance. In addition, when a compound represented by the above Chemical Formula 3 is used within the above range, the organosilane condensation polymerization product may secure improved etching resistance against an oxygen plasma as well as improved storage stability.

The hydrolysis may be performed in a reaction solvent under an acid catalyst.

An acid catalyst may adjust a rate of a hydrolysis reaction or a condensation polymerization reaction of the aforementioned compounds, and thus an organosilane condensation polymerization product having a desired molecular weight may be prepared. Such an acid catalyst may be a suitable acid catalyst. For example, the acid catalyst may include an inorganic acid selected from nitric acid, sulfuric acid, hydrochloric acid, hydrofluoric acid, bromic acid, iodic acid, and the like; an alkyl ester of organic sulfonic acid selected from p-toluene sulfonate hydrate (e.g., p-toluene sulfonate monohydrate), 2,4,4,6-tetrabromocyclohexadienone, benzoin tosylate, 2-nitrobenzyl tosylate, diethylsulfate, and the like; or a combination thereof. The acid catalyst may be used in an amount of about 0.001 to about 5 parts by weight based on 100 parts by weight of the compounds represented by the above Chemical Formulae 1 to 3. When the acid catalyst is used in the above range, the reaction rate may be adjusted to prepare an organosilane condensation polymerization product having a desired molecular weight.

The reaction solvent may include alcohols such as methanol, ethanol, and the like. The reaction solvent may adjust a hydrolysis degree of the Si—OR moieties, and thus may increase stability of an organosilane condensation polymerization product. The reaction solvent may be included in an amount of about 100 to about 900 parts by weight based on 100 parts by weight of the compounds represented by the above Chemical Formulae 1 to 3.

The organosilane condensation polymerization product may be a condensation polymerization product of compounds represented by the following Chemical Formulae 4 to 6 that are hydrolyzed products of the compounds represented by the above Chemical Formulae 1 to 3.

[Chemical Formula 4]

In Chemical Formula 4, $R^1$ may be a substituted or unsubstituted C1 to C6 alkyl group, X may be a substituted or unsubstituted C6 to C30 aryl group, and a may be greater than zero and less than or equal to 3.

[Chemical Formula 5]

In Chemical Formula 5, $R^2$ may be a substituted or unsubstituted C1 to C6 alkyl group, $R^3$ may be a substituted or unsubstituted C1 to C12 alkyl group, and b may be greater than zero and less than or equal to 3.

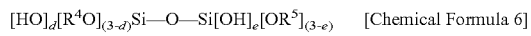

[Chemical Formula 6]

In Chemical Formula 6, $R^4$ and $R^5$ each independently may be a substituted or unsubstituted C1 to C6 alkyl group, and d and e each independently may be greater than zero and less than or equal to 3.

The alkyl group may be a linear or branched alkyl group.

The organosilane condensation polymerization product according to an embodiment may include a repeating unit represented by the following Chemical Formula 7:

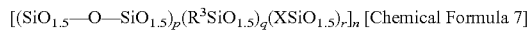

[Chemical Formula 7]

In Chemical Formula 7, $R^3$ and X may be the same as defined above in respective Chemical Formulae 1 and 2, $0.001 \leq p \leq 0.9$, $0.001 \leq q \leq 0.9$, $0.001 < r < 0.9$, $p+q+r=1$, n may range from about 50 to about 300, and the order of the $(SiO_{1.5}—O—SiO_{1.5})$, $(R^3SiO_{1.5})$, and $(XSiO_{1.5})$ moieties may be random.

The organosilane condensation polymerization product may have a weight average molecular weight of about 2,000 to about 50,000. In particular, the organosilane condensation polymerization product may have a weight average molecular weight of about 3,000 to about 20,000, and thus production of a gel may be prevented, thereby improving coating performance on a substrate.

In addition, the organosilane condensation polymerization product may be included in an amount of about 0.1 to about 50 parts by weight based on 100 parts by weight of the resist underlayer composition. In particular, the organosilane condensation polymerization product may be included in an amount of about 0.5 to about 30 parts by weight, and thus coating performance on a substrate may be improved.

In the resist underlayer composition, the solvent may cause the film to be dried slowly, and thus may substantially prevent voids and improve flatness. The kind of solvent may be a suitable kind of solvent. For example, a solvent may have a high boiling point that volatilizes at a temperature slightly lower than a temperature at which the resist underlayer composition is to be coated, dried, and cured. Examples of the solvent may include one selected from acetone, tetrahydrofuran, benzene, toluene, diethylether, chloroform, dichloromethane, ethyl acetate, propylene glycol monomethyl ether, propylene glycol ethyl ether, propylene glycol propyl ether, propylene glycol monomethyl ether acetate, propylene glycol ethyl ether acetate, propylene glycol propyl ether acetate, ethyl lactate, δ-butyrolactone, methyl isobutyl ketone, dimethylether, dibutylether, methanol, ethanol, tetrabutylammoniumacetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrite, tetrabutyl ammonium p-toluene sulfonate, tetrabutyl ammonium phosphate, and a combination thereof.

The resist underlayer composition according to an embodiment may further include an additive selected from the group of a cross-linking agent, a radical stabilizer, a surfactant, pH controlling agent, and a combination thereof.

The resist underlayer composition may further include as an additive a cross-linking catalyst selected from a sulfonate salt of an organic base (for example, pyridinium p-toluene sulfonate, amidosulfobetain-16, ammonium(−)-camphor-10-sulfonate, and the like), ammonium formate, an alkylammonium formate (for example, triethylammonium formate, trimethylammonium formate, tetramethylammonium formate, tetrabutylammonium formate, and the like), pyridinium formate, alkylammoniumnitrate (for example, tetramethylammonium nitrate, tetrabutyl ammonium nitrate, and the like), and a combination thereof.

The cross-linking catalyst may be added singularly to a composition including the organosilane condensation polymerization product and a solvent, or the cross-linking catalyst may be added along with an additive selected from the group of the cross-linking agent, radical stabilizer, surfactant, pH controlling agent, and a combination thereof.

When the resist underlayer composition includes an additive, each additive may be included in an amount of about 0.0001 to about 1 part by weight based on 100 parts by weight of the organosilane condensation polymerization product, and thus improved storage stability may be obtained.

According to an embodiment, a method of manufacturing a semiconductor integrated circuit device includes: providing a material layer on a substrate; forming a first resist underlayer including an organic material on the material layer; spin-on coating the resist underlayer composition on the first resist underlayer to form a second resist underlayer; forming a radiation-sensitive imaging layer on the second resist underlayer; exposing the radiation-sensitive imaging layer to radiation in a pattern to form a pattern of radiation-exposed regions in the radiation-sensitive imaging layer; selectively removing the radiation-sensitive imaging layer and portions of the second resist underlayer to expose portions of the first resist underlayer; selectively removing the second resist underlayer and the portions of the first resist underlayer to expose portions of the material layer; and etching the exposed portions of the material layer using the first resist underlayer as a mask to form a patterned material layer.

For example, a method of patterning a material layer may be carried out in accordance with the following procedure.

First, a material (e.g., aluminum or silicon nitride (SiN)) to be patterned may be applied to a silicon substrate by a suitable technique. The material to be patterned by using the resist underlayer composition may be an electrically conductive, semi-conductive, magnetic, or insulating material.

A first resist underlayer including an organic material may be provided on the material to be patterned. The first resist underlayer may be formed by using an organic material including carbon, hydrogen, oxygen, and the like, at a thickness of about 200 Å to about 12000 Å. The first resist underlayer may be a suitable underlayer, and may be formed according to a suitable thickness using suitable materials.

Thereafter, the resist underlayer composition according to an embodiment may be spin-on-coated to a thickness of about 100 Å to about 4000 Å, and baked to form a second resist underlayer.

The baking for the second resist underlayer may be performed at a temperature of about 100° C. to about 300° C.

When baked within the above range, a Si content of the underlayer may increase to provide a dense underlayer.

A radiation-sensitive imaging layer may be formed on the second resist underlayer. Light exposure and development may be performed to form a pattern on the radiation-sensitive imaging layer. The radiation-sensitive imaging layer (and an anti-reflection layer, if included) may be selectively removed to expose portions of the material layer and dry etching may be performed using an etching gas. Examples of the etching gas may include $CHF_3$, $CH_2F_2$, $CF_4$, $CH_4$, $N_2$, $O_2$, $Cl_2$, $BCl_3$, and a mixed gas thereof. After forming a patterned material layer, any conventional photoresist stripper may be used to remove a remaining radiation sensitive imaging layer.

In an embodiment, the method may further include forming an anti-reflection coating on the second resist underlayer after forming the second resist underlayer. A resist underlayer composition according to an embodiment may include a compound represented by Chemical Formula 1, and thus may have an improved anti-reflection effect such that a separate anti-reflection coating may not be needed, however, a separate anti-reflection coating may be included to further improve absorbance, photo profile, and the like. The anti-reflection coating may be formed by a suitable method.

The aforementioned manufacturing method may provide a patterned device. The device may be a semiconductor integrated circuit device. Particularly, the method may be applied to the areas with a patterned material layer structure, such as a metal wiring line, a hole for a contact or a bias, an insulation section such as a multi-mask trench or shallow trench insulation, a trench for a capacitor structure, and the like. In addition, the method may be applied to the formation of a patterned layer of oxide, nitride, polysilicon, chromium, and the like. Embodiments are not limited to a specific lithographic method or a specific device structure.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the embodiments as exemplified in the Examples or as necessarily being outside the scope of the embodiments in every respect.

COMPARATIVE EXAMPLE 1

37 g of methyltrimethoxysilane, 13.4 g of phenyltrimethoxysilane, and 110 g of hexaethoxydisilane were dissolved in 320 g of PGMEA (propylene glycol monomethyl ether acetate) in a 1L 4-necked flask having an mechanical agitator, a cooler, a funnel for addition in a dropwise fashion, and a pipe for injecting nitrogen gas, and 76 g of a 0.5% nitric acid aqueous solution was added thereto. Next, the mixture was reacted at room temperature for one hour, and a negative pressure was applied thereto to remove methanol and ethanol produced therein. Then, the resulting reactant was maintained at 50° C. and reacted for 2 days. After the reaction, 98 g of PGMEA was added to 2 g of the organosilane condensation polymerization product (having a weight average molecular weight=10,000) solution to prepare a diluted solution.

Then, 0.004 g of pyridinium p-toluene sulfonate was added to the diluted solution to prepare a resist underlayer composition.

The resist underlayer composition was spin-on-coated on a silicon wafer and baked at 240° C. for 60 seconds and then, additionally baked at 400° C. for 120 seconds, forming a 350 Å-thick film.

COMPARATIVE EXAMPLE 2

37 g of methyltrimethoxysilane, 13.4 g of phenyltrimethoxysilane, and 110 g of hexaethoxydisilane were dissolved in 320 g of PGMEA (propylene glycol monomethyl ether acetate) in a 1L 4-necked flask having an mechanical agitator, a cooler, a funnel for addition in a dropwise fashion, and a pipe for injecting nitrogen gas, and 76 g of a 0.5% nitric acid aqueous solution was added thereto. Next, the mixture was reacted at room temperature for 1 hour, and a negative pressure was applied thereto to remove methanol and ethanol produced therein. Then, the resulting reactant was maintained at 50° C. and reacted for 2 days. After the reaction, 98 g of PGMEA was added to 2 g of the organosilane condensation polymerization product (having a weight average molecular weight=10,000) solution to make the solution diluted.

Then, 0.004 g of pyridinium p-toluene sulfonate was added to the diluted solution, preparing a resist underlayer composition.

The resist underlayer composition was spin-on-coated on a silicon wafer and baked at 240° C. for 60 seconds to form a 350Å-thick film.

EXAMPLE 1

23.5 g of methyltrimethoxysilane, 8.7 g of phenyltrimethoxysilane, and 75.1 g of hexamethoxydisiloxane were dissolved in 410 g of PGMEA (propylene glycol monomethyl ether acetate) in a 1L 4-necked flask having an mechanical agitator, a cooler, a funnel for addition in a dropwise fashion, and a pipe for injecting nitrogen gas, and 76 g of a 0.5% nitric acid aqueous solution was added thereto. Next, the mixture was reacted at room temperature for 1 hour, and a negative pressure was applied thereto to remove methanol and ethanol produced therein. The resulting reactant was maintained at 50° C. and reacted for 2 days. After the reaction, 98 g of PGMEA was added to 2 g of the organosilane condensation polymerization product (having a weight average molecular weight=10,000) solution to make the solution diluted.

Then, 0.004 g of pyridinium p-toluene sulfonate was added to the diluted solution to prepare a resist underlayer composition.

The resist underlayer composition was spin-on-coated on a silicon wafer and baked at 240° C. for 60 seconds to form a 350 Å-thick film.

EXPERIMENTAL EXAMPLE 1

Storage Stability Evaluation

The organosilane condensation polymerization product solutions according to

Comparative Examples 1 and 2 and Example I were evaluated regarding storage stability.

Specifically, the organosilane condensation polymerization product solutions according to Comparative Examples 1 and 2 and Example 1 were stored at 40° C. for 30 days and evaluated regarding solution state and film thickness after the coating.

As a result, the organosilane condensation polymerization product solutions according to Comparative Examples 1 and 2 and Example 1 all substantially maintained their molecular weights after a predetermined time, and they showed little change (<10Å) in the thickness even after they formed a coating. Such results show that the organosilane condensation polymerization product solution according to Comparative Examples 1 and 2 and Example 1 all had excellent storage stability.

EXPERIMENTAL EXAMPLE 2

Measurement of Refractive Index and Extinction Coefficient

In general, a refractive index and an extinction coefficient are factors showing a relationship between reflectance and thickness before an exposure experiment. Accordingly, refractive index (n) and extinction coefficient (k) of the films according to Comparative Examples 1 and 2 and Example 1 were measured by using an ellipsometer (J. A. Woollam Co.) at a wavelength of 193 nm.

The results showed that the films according to Comparative Examples 1 and 2 and Example 1 all had substantially the same level of refractive index (n=1.67) and extinction coefficient (k=0.16 to 0.17).

EXPERIMENTAL EXAMPLE 3

Measurement of Contact Angle

Contact angles of the films according to Comparative Examples 1 and 2 and Example 1 were measured. The measurement equipment was DAS-100 (Kruess). Specifically, 5 points of 3 μl of water were dropped onto each surface and the angle between the surface and the water drop was measured.

The measurement results showed that the films according to Comparative Examples 1 and 2 had contact angles of 69° and 71.8°, respectively, and the film of Example 1 had a contact angle of 68.4°. Such results imply that the films had relatively hydrophilic properties.

EXPERIMENTAL EXAMPLE 4

Measurement of Etching Rate

The silicon wafers according to Comparative Examples 1 and 2 and Example 1 was bulk-dry-etched for 15 seconds under an etching condition of 60 mTorr, 270W/OW, 20 $N_2$, 40 $O_2$, and 200 Ar and then, thickness was measured and an etching rate per unit time was calculated. Herein, $N_2$ and Ar were used as flowing gases, while $O_2$ was used as a main etching gas. The results are provided in the following Table 1.

TABLE 1

| | Etching rate (Å/sec) |
|---|---|
| Comparative Example 1 | 3.5 |
| Comparative Example 2 | 4.7 |
| Example 1 | 3.3 |

As shown in Table 1, the silicon wafer according to Example 1 had improved etching resistance against $O_2$ plasma compared with the silicon wafers according to Comparative Examples 1 and 2. Notably, Comparative Example 1 was subjected to additional baking at 400° C. for 120 seconds, and Example 1 had improved etching resistance compared to Comparative Example 1 without being subjected to additional baking.

By way of summary and review, an underlayer including a carbon-based hard mask and a silicon-based underlayer may show excellent etching selectivity when used in patterning an underlying substrate. Specifically, the carbon-based underlayer may be formed on a substrate to be patterned and then a silicon-based underlayer may be made thereon and finally, a photoresist may be coated. Then, the pattern-transferred silicon-based underlayer may act as a mask for etching the carbon-based underlayer to transfer a pattern thereon, and then, the carbon-based underlayer may be used as a mask to transfer the pattern on the substrate. The silicon-based underlayer may have a higher etching selectivity for the photoresist than the substrate, and thus it may easily transfer a pattern from even a thin photoresist. As a result, even a thin photoresist may be used to etch a substrate down to a desired depth (i.e., without the photoresist being entirely consumed during etching).

An underlayer may be formed in a chemical vapor deposition (CVD) method during mass-production of semiconductors. However, the CVD method may produce particles inside the thin film. In addition, these particles may have a detrimental influence on characteristics of a semiconductor device, e.g., if the semiconductor device has a fine circuit therein with a narrower line width. The CVD process may also take a long time to deposit a thin film, and this may cause a problem of throughput deterioration. In addition, the CVD process may require expensive equipment An underlayer composition may be applicable by a spin-on-coating process, and thus may avoid the above problems associated with CVD. The spin-on coating may easily control the number of particles, have a fast processing time, and use a coater with no additional cost for new equipment. However, the underlayer material applied by the spin-on coating process may still have problems. In particular, in order to increase etching resistance against $O_2$ plasma, a silicon underlayer may be desired to contain a large amount of silicon and it may also be important how densely a Q structure network in the silicon underlayer is formed during a baking process. However, it may be difficult to control the reactions for synthesizing a resin containing an large amount of silicon (e.g., if an additional high temperature baking process is used), and the resulting resin may also have some drawbacks such as poor coating properties, and a lower level of storage stability, and the like when it is prepared as an actual product.

The resist underlayer composition according to the embodiments may be capable of forming a network of dense Q structure in an underlayer through a low temperature baking process without an additional high temperature baking process, and thus may have improved coating properties and storage stability as well as improved etching resistance against $O_2$ plasma and improved curability. Accordingly, the resist underlayer composition may be used to fabricate a semiconductor integrated circuit device having a fine pattern as well as to improve a photo patterning process in general.

According to an embodiment, a resist underlayer composition may include an organosilane condensation polymerization product including a repeating unit derived from a hydrolyzed product of a compound including a Si—O—Si bond, and thus may have improved etching resistance against $O_2$ plasma and improved coating properties and storage stability. Comparable compounds including a Si—Si bond may form a Si—O—Si bond in a resist underlayer through an additional high temperature baking process. However, in the composition for a resist underlayer according to an embodiment, the compound including a Si—O—Si bond may form a resist underlayer having a Si—O—Si bond through a low temperature baking process without requiring an additional high temperature baking process. In addition, the composition may have excellent curability such that it may form a network having a dense Q structure. As a result, it is possible to provide a resist underlayer having anti-reflection properties and excellent etching resistance.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A resist underlayer composition, comprising:
    a solvent; and
    an organosilane condensation polymerization product prepared by conducting a condensation polymerization of hydrolyzed products produced from a compound represented by Chemical Formula 1, a compound represented by Chemical Formula 2, and a compound represented by Chemical Formula 3:

    [$R^1O$]$_3$Si—X    [Chemical Formula 1]

wherein, in Chemical Formula 1,
    $R^1$ is a substituted or unsubstituted C1 to C6 alkyl group, and X is a substituted or unsubstituted C6 to C30 aryl group,

    [$R^2O$]$_3$Si—$R^3$    [Chemical Formula 2]

wherein, in Chemical Formula 2,
    $R^2$ is a substituted or unsubstituted C1 to C6 alkyl group, and $R^3$ is a substituted or unsubstituted C1 to C12 alkyl group,

    [$R^4O$]$_3$Si—O—Si[$OR^5$]$_3$    [Chemical Formula 3]

wherein, in Chemical Formula 3,
    $R^4$ and $R^5$ are each independently a substituted or unsubstituted C1 to C6 alkyl group.

2. The resist underlayer composition as claimed in claim 1, wherein the hydrolyzed products produced from the compounds represented by Chemical Formulae 1 to 3 are compounds represented by Chemical Formulae 4 to 6, respectively:

    [HO]$_a$[$R^1O$]$_{(3-a)}$Si—X    [Chemical Formula 4]

wherein, in Chemical Formula 4,
    $R^1$ is a substituted or unsubstituted C1 to C6 alkyl group, X is a substituted or unsubstituted C6 to C30 aryl group, and a is greater than zero and less than or equal to 3,

    [HO]$_b$[$R^2O$]$_{(3-b)}$Si—$R^3$    [Chemical Formula 5]

wherein, in Chemical Formula 5,
    $R^2$ is a substituted or unsubstituted C1 to C6 alkyl group, $R^3$ is a substituted or unsubstituted C1 to C12 alkyl group, and b is greater than zero and less than or equal to 3,

    [HO]$_d$[$R^4O$]$_{(3-d)}$Si—O—Si[OH]$_e$[$OR^5$]$_{(3-e)}$    [Chemical Formula 6]

wherein, in Chemical Formula 6,
    $R^4$ and $R^5$ are each independently a substituted or unsubstituted C1 to C6 alkyl group, and d and e are each independently greater than zero and less than or equal to 3.

3. The resist underlayer composition as claimed in claim 1, wherein the organosilane condensation polymerization product includes a repeating unit represented by Chemical Formula 7:

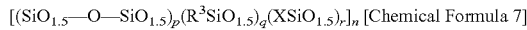
    [(SiO$_{1.5}$—O—SiO$_{1.5}$)$_p$($R^3$SiO$_{1.5}$)$_q$(XSiO$_{1.5}$)$_r$]$_n$    [Chemical Formula 7]

wherein, in Chemical Formula 7,
    $R^3$ is a substituted or unsubstituted C1 to C12 alkyl group,
    X is a substituted or unsubstituted C6 to C30 aryl group,
    $0.001 \leq p \leq 0.9$, $0.001 \leq q \leq 0.9$, $0.001 \leq r \leq 0.9$, $p+q+r=1$, and n ranges from about 50 to about 300.

4. The resist underlayer composition as claimed in claim 1, wherein the organosilane condensation polymerization product is obtained by carrying out a condensation polymerization with the hydrolyzed products prepared from about 5 to about 90 parts by weight of the compound represented by Chemical Formula 1, about 5 to about 90 parts by weight of the compound represented by Chemical Formula 2, and about 5 to about 90 parts by weight of the compound represented by Chemical Formula 3, based on 100 parts by weight of the compounds represented by Chemical Formulae 1 to 3.

5. The resist underlayer composition as claimed in claim 1, wherein the hydrolyzed products are obtained through hydrolysis of the compounds of Chemical Formulae 1 to 3 under an acid catalyst selected from nitric acid, sulfuric acid, hydrochloric acid, hydrofluoric acid, bromic acid, iodic acid, p-toluene sulfonate hydrate, 2,4,4,6-tetrabromocyclohexadienone, benzoin tosylate, 2-nitrobenzyl tosylate, diethylsulfate, and a combination thereof.

6. The resist underlayer composition as claimed in claim 5, wherein the acid catalyst is included in an amount of about 0.001 to about 5 parts by weight based on 100 parts by weight of the compounds represented by Chemical Formulae 1 to 3.

7. The resist underlayer composition as claimed in claim 5, wherein the hydrolysis is carried out in an alcohol-based reaction solvent.

8. The resist underlayer composition as claimed in claim 1, wherein the organosilane condensation polymerization product has a weight average molecular weight of about 2,000 to about 50,000.

9. The resist underlayer composition as claimed in claim 1, wherein the organosilane condensation polymerization product is included in an amount of about 0.1 to about 50 parts by weight based on 100 parts by weight of the resist underlayer composition.

10. The resist underlayer composition as claimed in claim 1, wherein the solvent is selected from acetone, tetrahydrofuran, benzene, toluene, diethylether, chloroform, dichloromethane, ethyl acetate, propylene glycol monomethyl ether, propylene glycol ethyl ether, propylene glycol propyl ether, propylene glycol monomethyl ether acetate, propylene glycol ethyl ether acetate, propylene glycol propyl ether acetate, ethyl lactate, δ-butyrolactone, methyl isobutyl ketone, dimethylether, dibutylether, methanol, ethanol, tetrabutylammonium acetate, tetrabutylammonium azide, tetrabutylammonium benzoate, tetrabutylammonium bisulfate, tetrabutylammonium bromide, tetrabutylammonium chloride, tetrabutylammonium cyanide, tetrabutylammonium fluoride, tetrabutylammonium iodide, tetrabutylammonium sulfate, tetrabutylammonium nitrite, tetrabutylammonium p-toluene sulfonate, tetrabutylammonium phosphate, and a combination thereof.

11. The resist underlayer composition as claimed in claim 1, wherein the resist underlayer composition further comprises an additive selected from a cross-linking agent, a radical stabilizer, a surfactant, a pH controlling agent, and a combination thereof.

12. The resist underlayer composition as claimed in claim 1, wherein the resist underlayer composition further comprises an additive selected from pyridinium p-toluene sulfonate, amidosulfobetain-16, ammonium(−)-camphor-10- sulfonate, ammonium formate, alkylammonium formate, pyridinium formate, alkylammonium nitrate, and a combination thereof.

13. A method of manufacturing a semiconductor integrated circuit device, comprising:
   providing a material layer on a substrate;
   forming a first resist underlayer including an organic material on the material layer;
   spin-on coating the resist underlayer composition as claimed in claim 1 on the first resist underlayer to form a second resist underlayer;
   forming a radiation-sensitive imaging layer on the second resist underlayer;
   exposing the radiation-sensitive imaging layer to radiation in a pattern to form a pattern of radiation-exposed regions in the radiation-sensitive imaging layer;
   selectively removing the radiation-sensitive imaging layer and portions of the second resist underlayer to expose portions of the first resist underlayer;
   selectively removing the second resist underlayer and the portions of the first resist underlayer to expose portions of the material layer; and
   etching the exposed portions of the material layer using the first resist underlayer as a mask to form a patterned material layer.

14. The method as claimed in claim 13, wherein the method further comprises forming an anti-reflection coating on the second resist underlayer after forming the second resist underlayer.

* * * * *